(12) United States Patent
Hayashi

(10) Patent No.: US 6,356,429 B2
(45) Date of Patent: Mar. 12, 2002

(54) CAPACITOR

(75) Inventor: Katsuhiko Hayashi, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/881,027

(22) Filed: Jun. 15, 2001

Related U.S. Application Data

(62) Division of application No. 09/252,224, filed on Feb. 18, 1999.

(51) Int. Cl.[7] .............................................. H01G 4/005
(52) U.S. Cl. .................... 361/303; 361/306.1; 361/309; 361/329
(58) Field of Search ............................. 361/303, 306.1, 361/307, 309, 311–313, 321.2, 321.3, 329, 330

(56) References Cited

U.S. PATENT DOCUMENTS

| 1,899,176 | A | * | 2/1933 | Bailey | 361/275.1 |
| 5,172,299 | A | * | 12/1992 | Yamada et al. | 361/321.2 |
| 5,173,670 | A | * | 12/1992 | Naito et al. | 333/184 |
| 5,459,642 | A | * | 10/1995 | Stoddard | 361/774 |
| 5,965,912 | A | * | 10/1999 | Stolfa et al. | 257/312 |
| 6,266,227 | B1 | * | 7/2001 | Konushi et al. | 361/306.1 |

* cited by examiner

Primary Examiner—Anthony Dinkins
(74) Attorney, Agent, or Firm—Oblon, Spivak, McClelland, Maier & Neustadt, P.C.

(57) ABSTRACT

A substantial comb-type lower electrode 11 is formed on a substrate 14, then a dielectric layer 13 is formed on the lower electrode 11, and then a substantial comb-type upper electrode 12 is formed on the dielectric layer 13. Respective element electrodes 16 (15) of one of the lower electrode 11 and the upper electrode 12 are arranged in blank areas between respective element electrodes 15 (16) of the other of the lower electrode 11 and the upper electrode 12.

8 Claims, 8 Drawing Sheets

CAPACITOR

This application is a div. of Ser. No.09/252,224 filed Feb. 18, 1999.

BACKGROUND OF THE INVENTION

The present invention relates to a capacitor which is employed in a MMIC (Monolithic Microwave Integrated Circuit), etc. in circuit portions, etc. of a radio device such as a portable telephone, a mobile phone, etc., for example.

As shown in figures on pages 176, 177 of "Foundation of Microwave Circuit and its Application" (published by Sogo Denshi Publishing Co., Ltd., Feb. 1, 1992), for example, as for the conventional capacitor constructed on the MMIC, there are a MIM (Metal Insulator Metal) capacitor shown in FIG. 8A as the first example and an inter-digital capacitor shown in FIG. 8B as the second example.

As shown in FIG. 8A, the MIM capacitor has a structure in which two conductors 1, 2 are stacked on a substrate 4 via a dielectric layer 3 to oppose to each other, and has such a feature that a large capacitance can be obtained by a relatively small pattern area. Since normally the MIM capacitor employed in the MMIC is formed by using a thin film process, a dielectric layer (e.g., $SiO_2$) formed by the chemical vapor deposition is employed as the dielectric layer 3, or the dielectric layer 3 can be formed with resin by coating a polyimide resin paste on a conductor being formed on the substrate, or a ceramic dielectric layer can be formed by coating the dielectric paste on the conductor formed on the substrate by using the sol-gel method, etc. and then firing it. Since the dielectric layer connected by the above method can be formed to have a thickness of about several $\mu$m, it is easy to implement the capacitor having a large capacitance with a small area.

As shown in FIG. 8B, the inter-digital capacitor as the second example in the prior art has a structure in which comb-type electrodes 5, 6 are opposed to each other on the same surface of the substrate 4. In other words, the comb-type electrodes 5, 6 have a plurality of element electrodes 7, 8 respectively, and the plurality of element electrodes 7, 8 are opposed to each other on a surface of the substrate 4 along the surface direction to form a capacitance. Normally, the inter-digital capacitor employed in the MMIC is formed by forming a conductive film on an overall surface of the substrate 4 by virtue of the sputtering, etc., then coating photoresist on the conductive film, then exposing and developing a pattern to be formed onto the photoresist, and then etching a conductive film portion to be removed. Hence, since both the comb-type electrodes 5, 6 of the inter-digital capacitor can be formed by the same step, they have a structure which has small variation of a capacitance value being accomplished in mass production especially.

According to the MIM capacitor shown in FIG. 8A as the first example in the prior art, the capacitance value is varied according to a film thickness of the dielectric layer 3 formed between the capacitor electrodes 1, 2. For example, in the case of the MIM capacitor which is formed to have the dielectric layer 3 of 5 $\mu$m thickness, the capacitance value to be formed is subjected to the variation of ±10% even if a film thickness of the dielectric layer 3 can be formed with a precision of ±0.5 $\mu$m. Though a precision of the capacitor depends on a precision of the filter circuit, etc., normally such precision of the capacitor employed in the filter circuit, etc. must be restrained in the range of about ±5% of the target value of the capacitance value, and the higher precision of the capacitor is also requested in some cases. Accordingly, in order to achieve such precision, a precision of the film thickness in forming the dielectric layer 3 must be suppressed less than ±0.25 $\mu$m. However, in order to form the dielectric layer 3 within the foregoing precision in mass production, there are problems that the film thickness is readily varied if any above-mentioned methods are used to form the dielectric layer 3 and that especially the capacitance value to be formed is ready to vary as the dielectric layer 3 is made thinner.

According to the inter-digital capacitor shown in FIG. 8B as the second example in the prior art, the stable capacitance value can be derived in mass production as mentioned above, but it is hard to form the large capacitance value. Therefore, in order to get the large capacitance, the patterns of the comb-type electrodes 5, 6 must be increased in size, and thus they are unsuitable for the narrow pattern regions. In addition, as the method of increasing the capacitance value, the clearances between the element electrodes 7, 8 of the comb-type electrodes 5, 6 which are opposed on the surface of the substrate 4 must be designed small.

However, clearances between the element electrodes 7, 8 are formed by the etching, as described above. Therefore, the etching conditions are strictly restricted if such clearances are set extremely narrow, so that there is a problem such that variation in forming the electrodes is caused. More particularly, due to slight variation of the etching conditions in mass production, the conductive film cannot be sufficiently etched and thus short-circuit between the element electrodes 7, 8 is caused. Conversely, due to overetching, the element electrodes 7, 8 are formed too narrow and thus the element electrodes 7, 8 are eliminated in some areas.

SUMMARY OF THE INVENTION

In view of the above problem, it is an object of the present invention to provide a capacitor employed in the MMIC and having a structure which is capable of increasing a capacitance in areas occupied by capacitor patterns, and also reducing the variation of the capacitance value in mass production.

In order to achieve this object, there are provided a capacitor of the present invention constructed by forming a substantial comb-type lower electrode on a substrate, then forming a dielectric layer on the lower electrode, and then forming a substantial comb-type upper electrode on the dielectric layer, wherein respective element electrodes of one of the lower electrode and the upper electrode are arranged in blank areas between respective element electrodes of the other of the lower electrode and the upper electrode.

Further, a capacitor of the present invention is constructed by forming a lower electrode on a substrate, then forming a dielectric layer on the lower electrode, and then forming an upper electrode on the dielectric layer, wherein one electrode of the lower electrode and the upper electrode has frame-like element electrodes which construct a continuous ladder shape while other electrode of the lower electrode and the upper electrode is formed like a comb shape, and element electrodes of the other electrode formed like the comb shape are placed in blank areas between the frame-like element electrodes of one electrode.

Furthermore, a capacitor of the present invention is constructed by forming a lower electrode on a substrate, then forming a dielectric layer on the lower electrode, and then forming an upper electrode on the dielectric layer, wherein one electrode of the lower electrode and the upper electrode has a plurality of loop portions, and element electrodes of an other electrode of the lower electrode and the upper electrode are placed in blank areas of the loop portions of the one electrode.

Also, in a capacitor of the present invention, a relationship $$W1 \geq W2 + 2 \cdot W3$$

is satisfied, where a width of a blank area between element electrodes of one electrode is set to W1, a width of an element electrode of the other electrode is set to W2, and a maximum assumed displacement of electrode patterns of the other electrode from a designed position is set to ±W3.

Moreover, in a capacitor of the present invention, the substrate is formed of ceramic dielectric substance, and the substrate has an external connecting electrode to be connected to an electrode formed on a mother board.

Still further, in a capacitor of the present invention, the external connecting electrode is formed on a surface of the substrate on which the lower electrode and the upper electrode are formed.

Still further, in a capacitor of the present invention, a solder precoat or a solder bump is formed on the external connecting electrode.

Still further, in a capacitor of the present invention, the lower electrode and the upper electrode are formed by using a photo-lithography technology respectively.

Still further, in a capacitor of the present invention, the dielectric layer is formed of resin material.

Still further, in a capacitor of the present invention, the dielectric layer is formed by dispersing and mixing high dielectric constant material, which consists of more than one of ceramic powder, glass powder, and high dielectric constant resin powder, into the resin material.

Still further, in a capacitor of the present invention, the dielectric layer is formed by coating a dielectric paste and firing it.

According to the present invention, the capacitor is constructed such that the element electrodes of one (the upper electrode or the lower electrode) of the comb-type electrodes are arranged in blank areas between the element electrodes or in the element electrodes of the other (the lower electrode or the upper electrode) of the comb-type electrodes. Thus, in the event that displacement of the opposing comb-type electrodes is caused, one sides of the element electrodes of one of the comb-type electrodes come close to the corresponding element electrodes of the other of the comb-type electrodes to then increase the capacitance value, but other sides of the element electrodes of one of the comb-type electrodes go away from the corresponding element electrodes of the other of the comb-type electrodes to then decrease the capacitance value. Therefore, there can be provided the capacitor which is capable of canceling variation of the capacitance value on both sides of the element electrodes, reducing variation of the capacitance value due to pattern displacement, and reducing variation of the capacitance value small.

In addition, since the dielectric layer is interposed between the underlying electrode and the overlying electrode, there is no possibility that short-circuit, etc. are not caused even if both electrodes are set in the close vicinity. Therefore, since both electrodes can be placed very closely, the capacitor having the large capacitance value can be fabricated.

DETAILED DESCRIPTION OF THE PREFERRED EMBODIMENTS

Figure 1A:
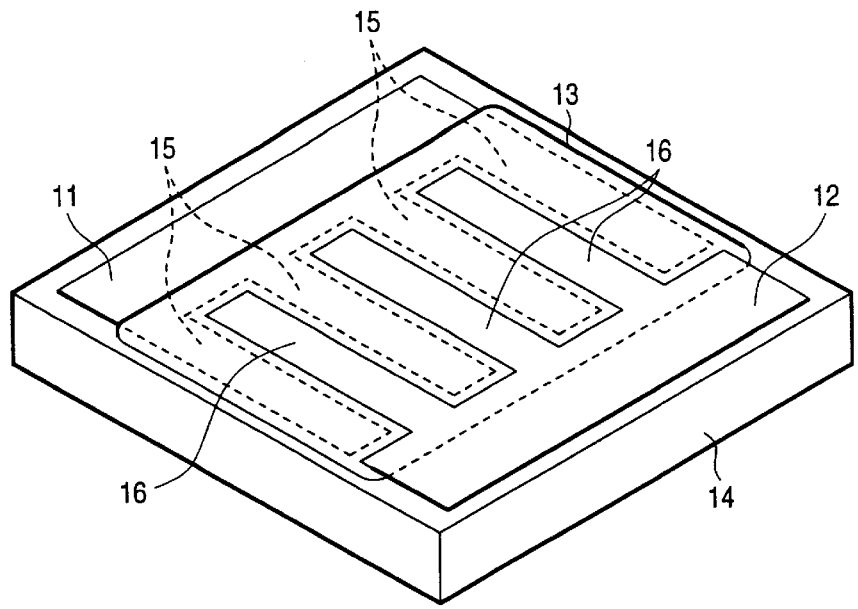
FIG. 1A is a perspective view showing a capacitor according to a first embodiment of the present invention.
Figure 1B:
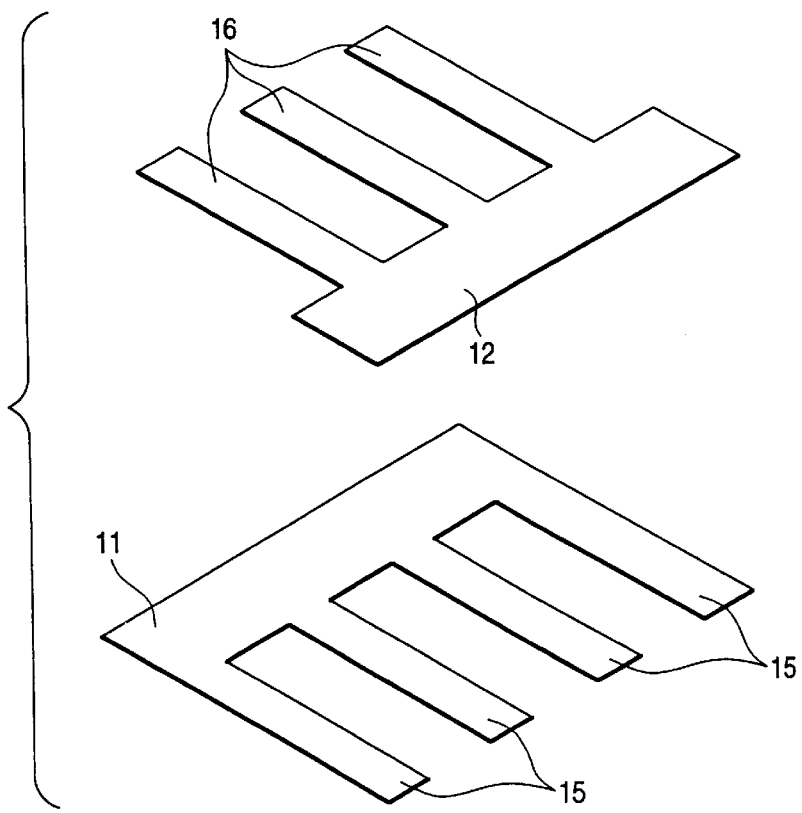
FIG. 1B is a perspective view showing electrode patterns of the capacitor.
Figure 2A:
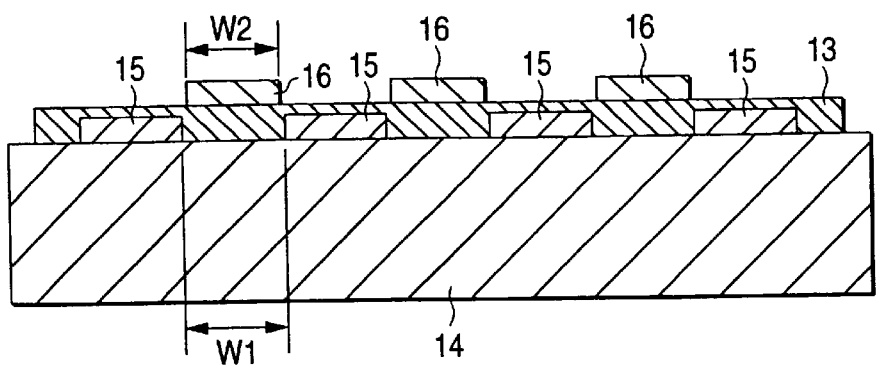
FIG. 2A is a sectional view showing the capacitor according to the first embodiment in FIGS. 1A and 2B.
Figure 2B:
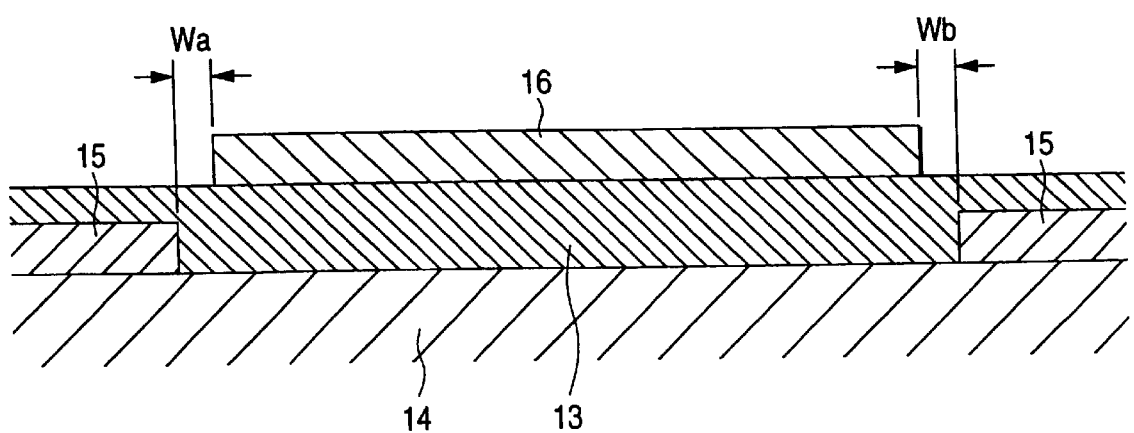
FIG. 2B is a view illustrating an operation of the capacitor.

FIG. 1A is a perspective view showing a capacitor according to a first embodiment of the present invention. FIG. 1B is a perspective view showing electrode patterns of the capacitor. FIG. 2A is a sectional view showing the capacitor according to the first embodiment in FIGS. 1A and 1B. FIG. 2B is a view illustrating an operation of the capacitor.

In the capacitor according to the first embodiment, as shown in FIG. 1A, FIG. 1B, and FIG. 2A, a comb-type lower electrode 11 serving as one electrode of the capacitor is formed on a substrate 14, then a dielectric layer 13 is formed thereon, and then a comb-type upper electrode 12 serving as the other electrode of the capacitor is formed thereon.

The lower electrode 11 and the upper electrode 12 have a plurality of element electrodes 15, 16 respectively. The element electrodes 16 of the upper electrode 12 are formed in respective blank areas formed between the element electrodes 15 of the lower electrode 11, and the element electrodes 15 of the lower electrode 11 are formed below respective blank areas formed between the element electrodes 16 of the upper electrode 12.

If the lower electrode 11 and the upper electrode 12 are opposed via the dielectric layer 13 as described above, distances Wa, Wb between the element electrodes 15, 16 can be designed extremely small (they can be designed as Wa=Wb) as shown in FIG. 2B, so that an acquired capacitance of the capacitor thus formed can be enhanced. In addition, if the dielectric layer 13 is formed of high dielectric constant material, the acquired capacitance can, of course, be increased. Meanwhile, since the electrodes 11, 12 are not opposed in structure along the laminated direction, a capacitance value of the capacitor thus formed is not affected by variation of a thickness of the dielectric layer 13 caused in mass production rather than the case where the electrodes are directly opposed along the laminated direction.

However, since the lower electrode 11 and the upper electrode 12 are not formed simultaneously in the capacitor according to the present invention, there is a possibility that a positional relationship between the element electrodes 15 of the lower electrode 11 and the element electrodes 16 of the upper electrode 12 via the dielectric layer 13 is varied in mass production. Thus, it is possible that the capacitance value to be produced is varied due to such displacement. In that case, a relationship between a width W1 of the blank area between the element electrodes 15 of the lower electrode 11 and a width W2 of the element electrode 16 of the upper electrode 12 may be set as $$W1 \geq W2 + 2 \cdot W3$$

if a maximum displacement (an amount of variation) in the positional relationship between the lower electrode 11 and the upper electrode 12 caused in the mass production relative to a designed position is ±W3.

According to such relationship, if the element electrode 16 is shifted close to the element electrode 15 located on the left side in FIG. 2B, for example, because of pattern displacement between the element electrodes 15, 16, the distance Wa between the element electrodes 15, 16 is reduced in FIG. 2B. At this time, the distance Wb between the element electrode 16 and the element electrode 15 located on the right side in FIG. 2B is increased according to the reduction in the distance Wa. Therefore, no variation of an overall capacitance value is caused, otherwise it is extremely small if caused. As a result, even if the positional relationship between the lower electrode 11 and the upper electrode 12 is varied, the obtained capacitance value is scarcely varied. The above equation means that the lower electrode 11 and the upper electrode 12 constituting the capacitor is designed under the condition that the distances (Wa, Wb) between the element electrodes 15, 16 are set to the amount of variation W3 (Wa=Wb=W3). It is of course that, if a manufacturing equipment which enables a high alignment precision is employed, the amount of variation W3 can be reduced to an extremely small value and thus a larger capacitance value can be achieved. In addition, the capacitor having a target capacitance can be fabricated with a small occupied area.

The width W1 between the element electrodes 15, 15 and the width W2 of the element electrode 16 can be set according to the capacity of the manufacturing equipment, the power of handling signal, etc. In the present embodiment, both side element electrodes 15 of the lower electrode 11 are positioned on the outside of the element electrodes 16 of the upper electrode 12 such that the lower electrode 11 substantially surrounds the upper electrode 12, but such pattern structures may be reversed in the vertical direction.

The capacitor in the present embodiment will be fabricated according to following steps. In order to form the lower electrode 11 on the substrate 14, a conductive film is formed on the substrate 14. It is preferable that this conductive film is formed of copper which has a good high frequency characteristic and in which electromigration, which reduces insulation performance between isolated conductors, is hard to occur. The conductive film is formed on the substrate 14 by the sputtering, etc. But, if a ceramic substrate is employed as the substrate 14, the conductive film can be formed by coating or printing a thick film conductive paste on the substrate 14 and then firing it.

The conductive film formed on the substrate 14 in this manner is formed into the comb-type lower electrode 11 by using the photolithography technology. More particularly, photoresist is coated on the conductive film, then the photoresist is exposed via a photomask which is formed as a substantial comb-shape, then the photoresist is developed and fixed and also etched areas of the conductive film is exposed, and then etching of the conductive film is performed in the etchant. With the above, the lower electrode 11 can be formed.

Next, the dielectric layer 13 will be formed in the following. The dielectric layer 13 may be formed of either resin material or ceramic material. In either case, a liquid coating is coated on an overall surface of the substrate 14, on which the comb-type lower electrode 11 has been formed, by the spin coating, etc. In the case of the resin material, the liquid coating is then cured as it is at the high temperature, and then formed into a target pattern by the photolithography technology. In the case of the ceramic material, a conductive paste is coated on the substrate 14 like the above and dried, then formed into the target pattern by the photolithography technology, and then fired, whereby the dielectric layer 13 can be formed. In the event that the ceramic dielectric layer is employed and also the copper is employed as the conductor on the substrate 14, it is needed that the ceramic dielectric layer 13 can be fired in the nitrogen atmosphere.

In order to form the upper electrode 12, a conductive film is formed on a surface on which the dielectric layer 13 has been formed. Formation of the upper electrode 12 is effected by using the foregoing photolithography technology. The copper is preferable for material of the upper electrode 12 based on the above reason, and the conductive film is formed by the sputtering, etc. In case the ceramic dielectric layer 13 has been employed, the conductive film can be formed by coating or printing a thick-film paste on a surface on which the dielectric layer 13 has been formed, and then firing it.

Figure 3A:
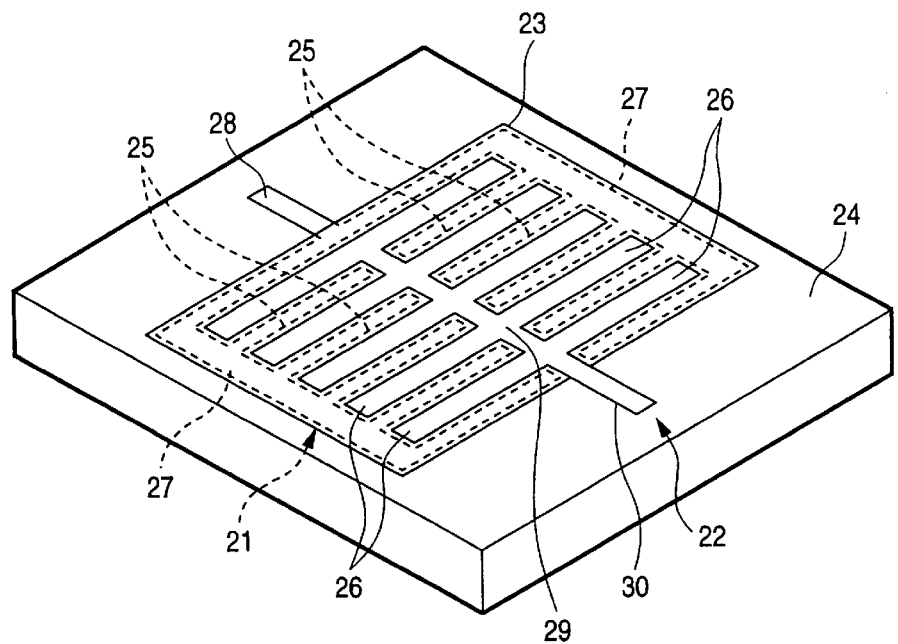
FIG. 3A is a perspective view showing a capacitor according to a second embodiment of the present invention.
Figure 3B:
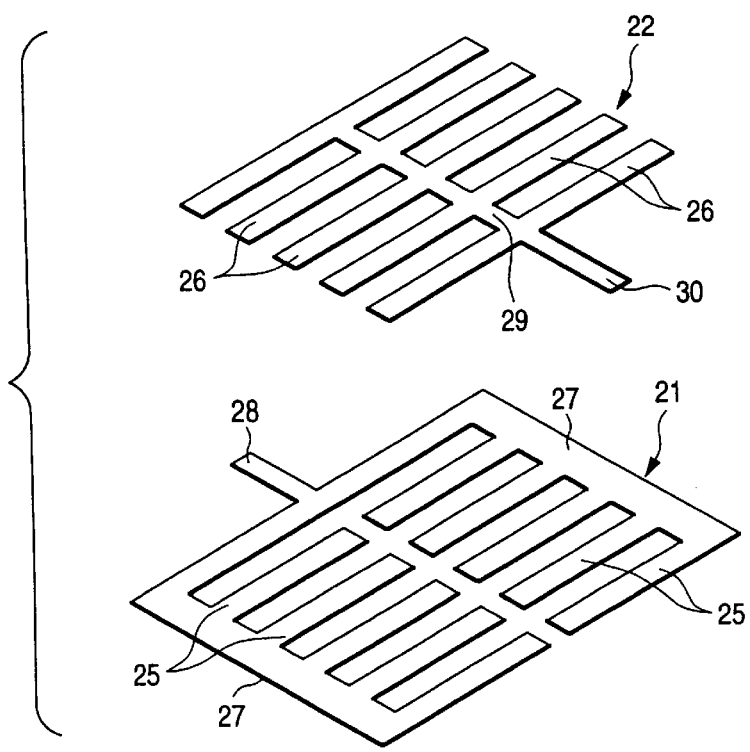
FIG. 3B is a perspective view showing electrode patterns of the capacitor.

FIG. 3A is a sectional view showing a capacitor according to a second embodiment of the present invention. FIG. 3B is a perspective view showing electrode patterns of the capacitor. In the present embodiment, a lower electrode 21 formed on a substrate 24 is formed into two sets of comb-shaped electrodes by extending inwardly a plurality of element electrodes 25 from both side leading electrodes 27, 27 in the opposing direction respectively. A dielectric layer 23 covers the lower electrode 21 except its terminal portion 28. An upper electrode 22 is formed by forming a plurality of element electrodes 26 on both sides of a center leading electrode 29, which is extended to a terminal portion 30, into a comb shape respectively. In this case, like the first embodiment, the element electrodes 26 of the upper electrode 22 are placed in the blank areas between the element electrodes 25 of the lower electrode 21, and also the element electrodes 25 of the lower electrode 21 are placed in the blank areas between the element electrodes 26 of the upper electrode 22.

According to the present embodiment in FIGS. 3A and 3B, lengths of the element electrodes 25, 26 can be reduced rather than the case where the comb-shaped electrode in which the element electrodes protrude only on one side is employed. As a result, inductance values of the element electrodes of the comb-shaped electrode can be made small, so that a self resonance frequency can be shifted to the high frequency side.

Figure 4A:
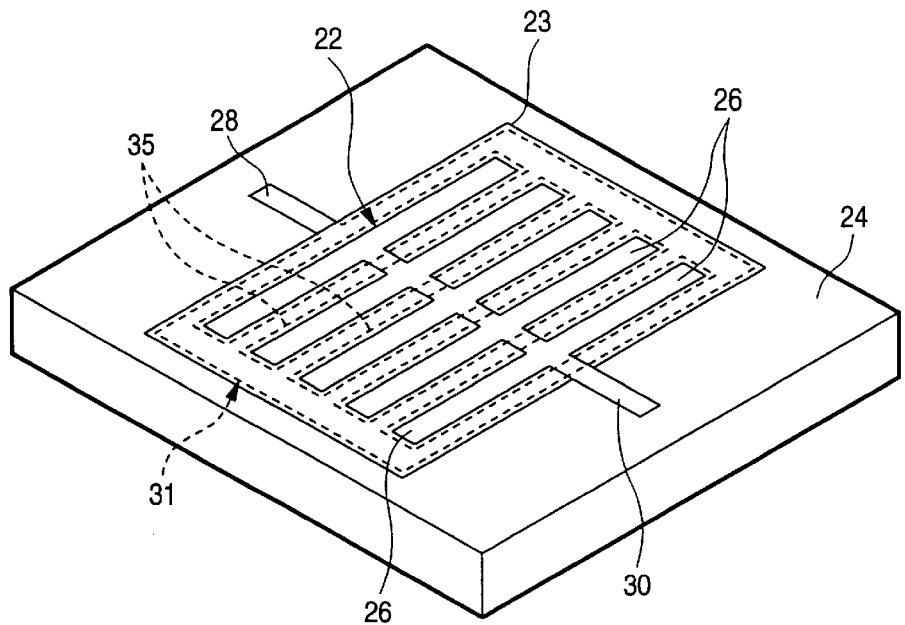
FIG. 4A is a perspective view showing a capacitor according to a third embodiment of the present invention.
Figure 4B:
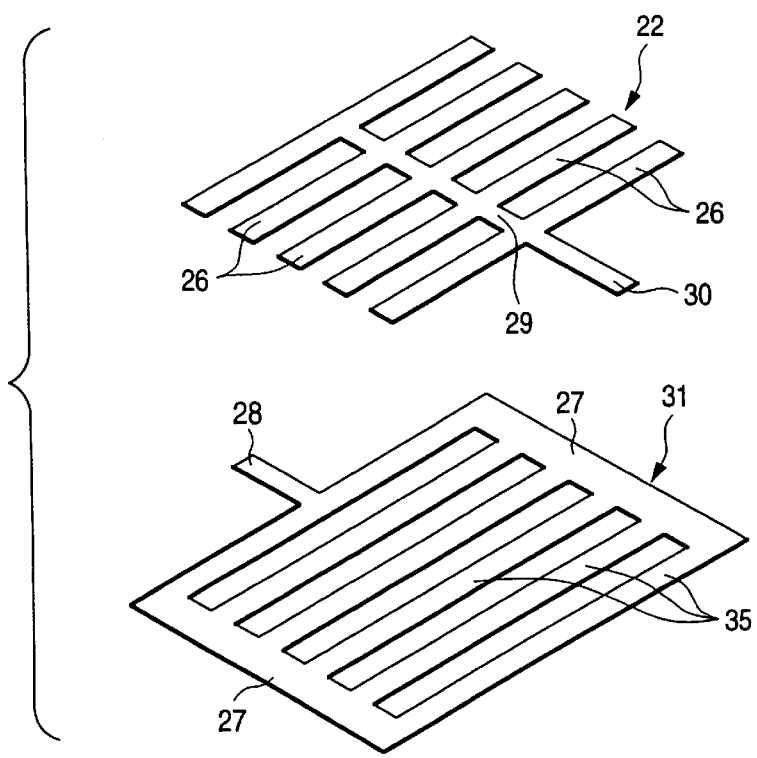
FIG. 4B is a perspective view showing electrode patterns of the capacitor.

FIG. 4A and FIG. 4B, which is depicted corresponding to FIG. 3A and FIG. 3B respectively, show a capacitor according to a third embodiment of the present invention. In the present embodiment, a lower electrode 31 is formed into a ladder shape by connecting both side leading electrodes 27, 27, which constitute a closed frame portion, by a plurality of element electrodes 35. In the meanwhile, like the embodiment in FIGS. 3A and 3B, the upper electrode 22 has a plurality of element electrodes 26 on both sides of the center leading electrode 29 in a comb-like fashion. Then, the element electrodes 26 of the upper electrode 22 are placed in blank areas between the element electrodes 35 of the lower electrode 31, and also the element electrodes 35 of the lower electrode 31 are placed in blank areas between the element electrodes 26 of the upper electrode 22. In this case, the center leading electrode 29 is placed on the element electrodes 35 of the lower electrode 31 so as to oppose to them via the dielectric layer 23 in the vertical direction.

The structure in FIGS. 4A and 4B is applicable in case a relatively large capacitance value is requested or in case a precision of the capacitance value is not strictly requested. In the embodiment in FIGS.4A and 4B, since the inductance value of the element electrodes 35 can be reduced much more than the case of FIGS. 3A and 3B and thus the resonance frequency can be increased, restriction on the use frequency due to the resonance frequency can be eased.

Figure 5A:
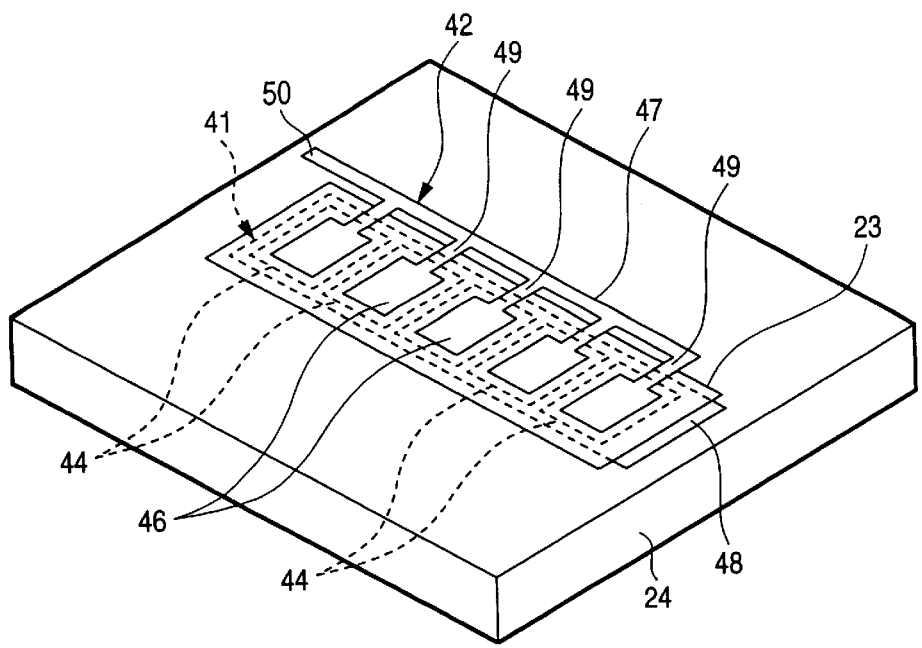
FIG. 5A is a perspective view showing a capacitor according to a fourth embodiment of the present invention.
Figure 5B:
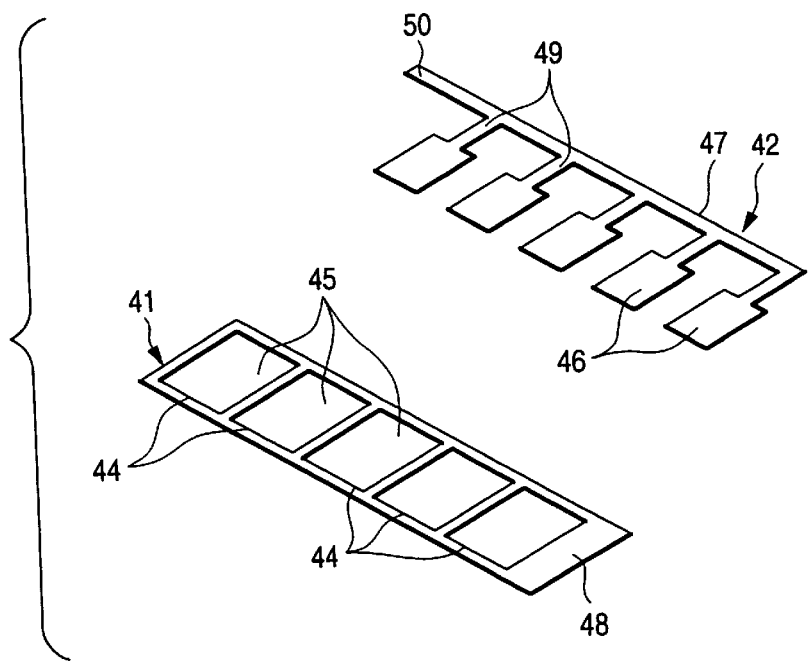
FIG. 5B is a perspective view showing electrode patterns of the capacitor.

FIG. 5A is a perspective view showing a capacitor according to a fourth embodiment of the present invention. FIG. 5B is a perspective view showing electrode patterns of the capacitor. In the present embodiment, a lower electrode 41 is formed into a plurality of continuous open or closed loop portions 44, as shown in FIG. 5B, on the substrate 24, then the lower electrode 41 is covered with the dielectric layer 23 other than a terminal portion 48, and then square element electrodes 46 of an upper electrode 42 are placed in blank areas 45 in the loop portions 44 of the lower electrode 41 and also the element electrodes 46 are connected to a leading electrode 47 of the upper electrode 42 via connecting portions 49 which are laid across a part of the lower electrode 41. The loop portions 44 may be formed into not only square but also other polygon or circle.

According to the embodiment in FIGS. 5A and 5B, even when patterns of upper electrode 42 are displaced relative to the lower electrode 41, variation of the capacitance value can be made small, like the above embodiments. If the connecting portions 49 for connecting the element electrodes 46 and the leading electrode 47 which is connected to a terminal portion 50 are selectively cut off, the capacitor in the present embodiment can be employed as a trimming capacitor.

Figure 6A:
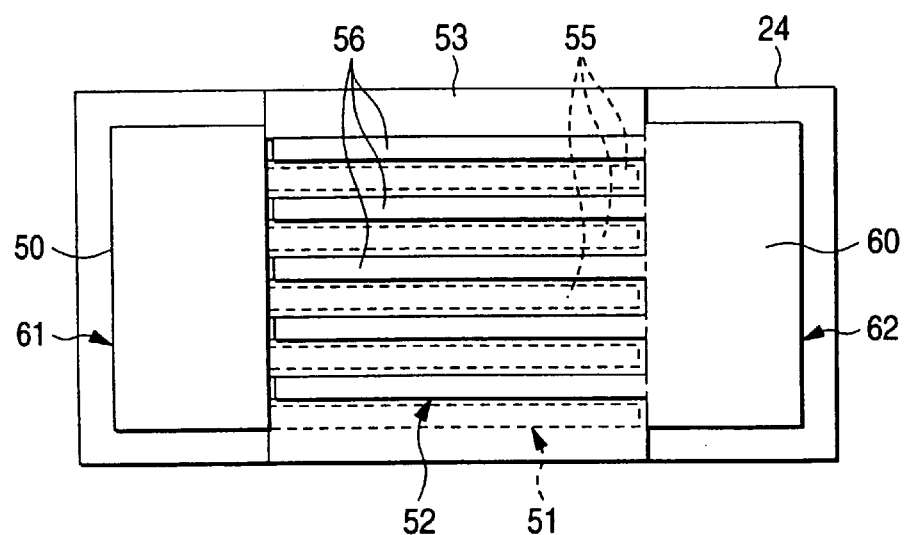
FIG. 6A is a plan view showing a capacitor according to a fifth embodiment of the present invention.
Figure 6B:
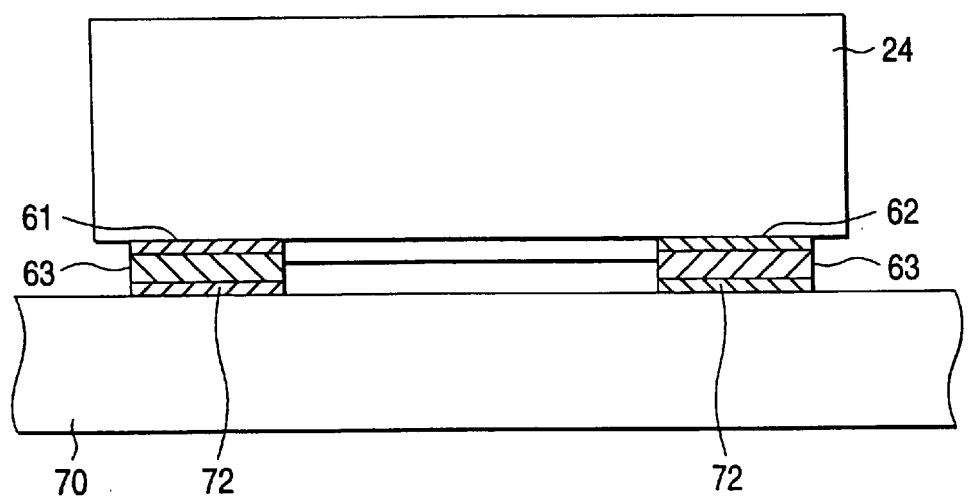
FIG. 6B is a side view showing an assembled structure of the capacitor.
Figure 7:
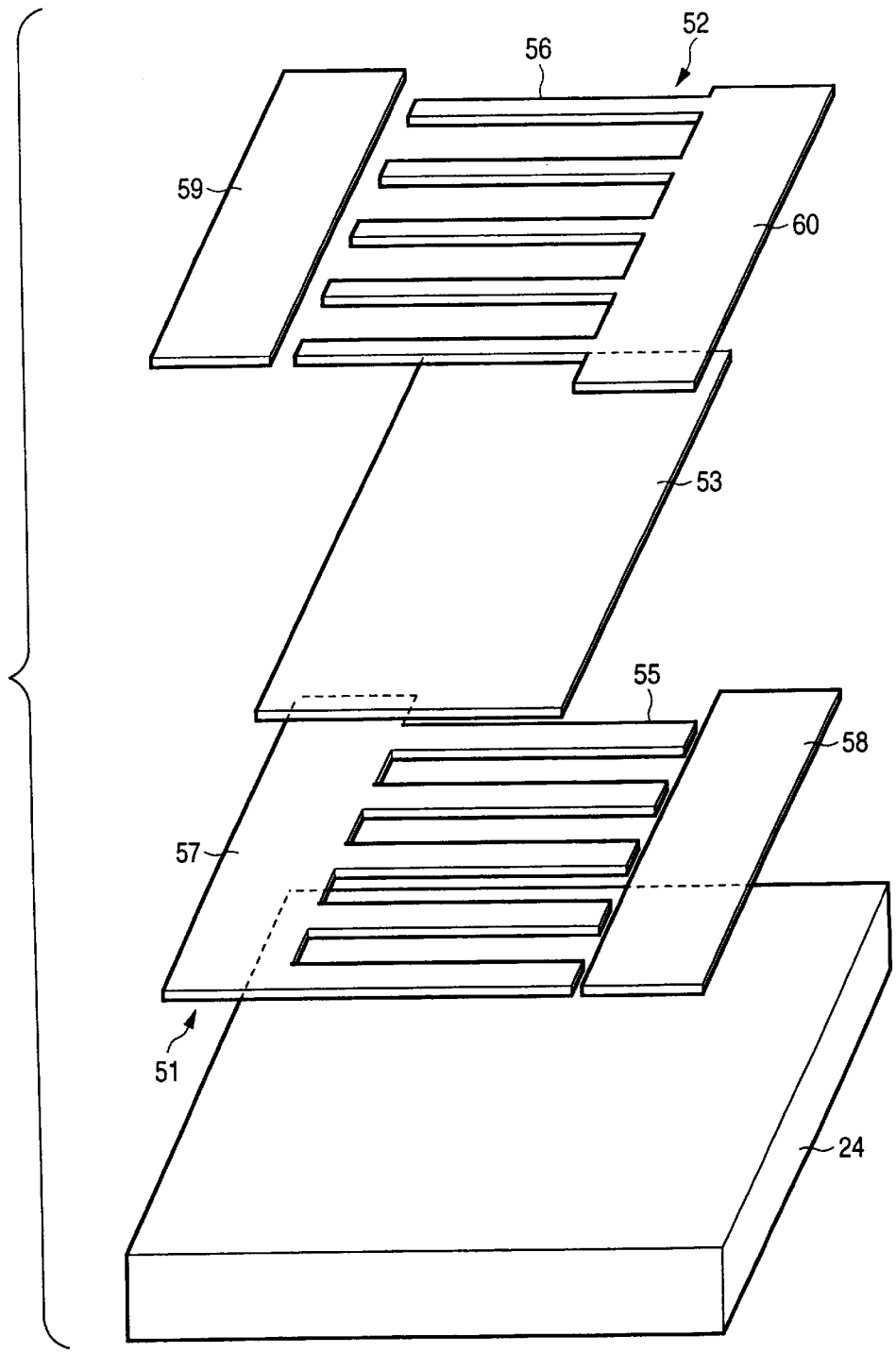
FIG. 7 is a perspective view showing electrode patterns of the fifth embodiment in FIGS. 6A and 6B.
Figure 8A:
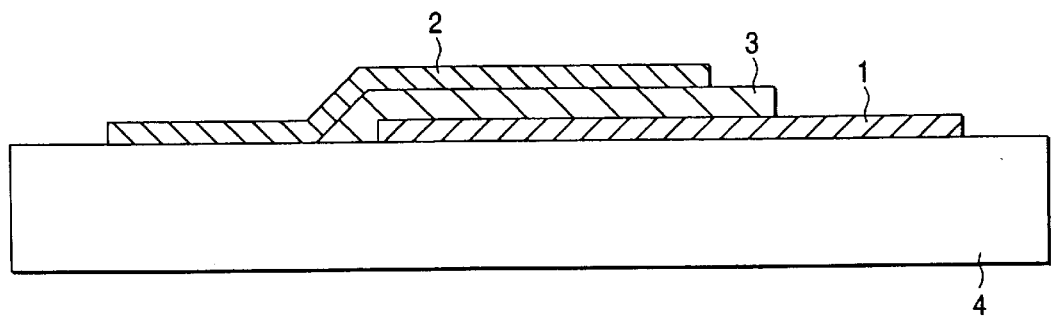
FIG. 8A is a sectional view showing a first example of a capacitor in the prior art.
Figure 8B:
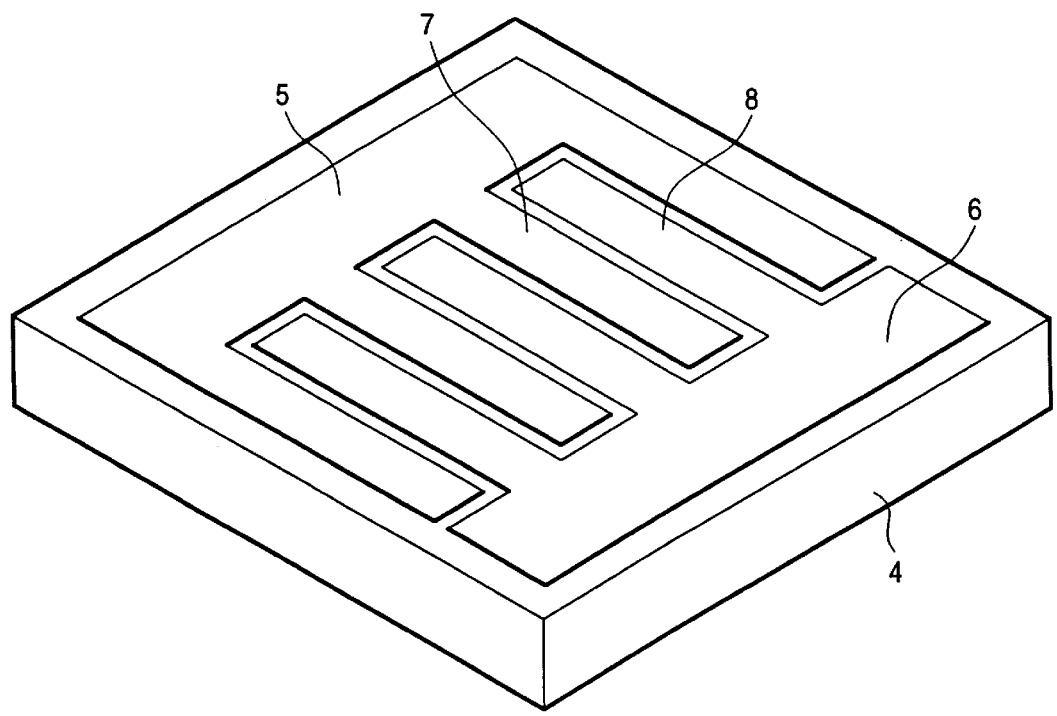
FIG. 8B is a perspective view showing a second example of a capacitor in the prior art.

FIG. 6A is a plan view showing a capacitor according to a fifth embodiment of the present invention. FIG. 6B is a side view showing an assembled structure of the capacitor onto a mother board 70. FIG. 7 is a perspective view showing electrode patterns of the fifth embodiment.

In the present embodiment in FIGS.6A and 6B and FIG. 7, in order to make it possible to mount the capacitor on the mother board 70 as a discrete part of a single function, externally connecting electrodes 61, 62 are provided to a ceramic dielectric substrate 24. As shown in FIG. 7, in the present embodiment, a first layer 57 of an externally connecting electrode for a lower electrode 51 and a first layer 58 of an externally connecting electrode for an upper electrode 52 are formed at the same time when the substantial comb-shaped lower electrode 51 which is placed on a surface of the ceramic dielectric substrate 24 is formed, then a dielectric layer 53 is deposited on element electrodes 55 of the lower electrode 51 and their peripheral regions, and then a comb- shaped upper electrode 52 is formed. Upon this formation of the upper electrode 52, a second layer 60 of the externally connecting electrode is stacked on the first layer 58 and also element electrodes 56 are stacked on the dielectric layer 53, and then a second layer 59 of the externally connecting electrode for the lower electrode 51 is stacked on the first layer 57 of the lower electrode 51. As a result, the externally connecting electrodes 61, 62 are provided onto a surface on which the lower electrode 51 and the upper electrode 52.

More particularly, it is preferable that the lower electrode 51 and the first layers 57, 58 of the externally connecting electrodes should be formed by the photolithography technology after a conductive paste is coated on an overall surface of the ceramic dielectric substrate 24 and then fired to form a conductive film. At this time, a copper is suitable for a used conductor since such copper has low electromigration, low solder leach, and low conductor resistance in the high frequency band.

Then, a heat-resistant resin film such as polyimide resin, epoxy resin, or the like, which acts as the dielectric layer 53, is formed on an entire surface of the substrate 24, and then the dielectric layer 53 formed on the first layers 57, 58 of the externally connecting electrodes is removed by using the photolithography technology.

Then, the second layer 59 of the externally connecting electrode for the lower electrode 51, the upper electrode 52, and the second layer 60 of the externally connecting electrode for the upper electrode 52 are formed integrally as the conductive film by sputtering the copper, if preferable. Then, like the case of the lower electrode 51, the second layers 59, 60 and the upper electrode 52 are formed by using the photolithography technology. As explained in the above embodiments, pattern formation of the upper electrode 52 is-performed such that, as shown in FIG. 6A, the element electrodes 56 (55) of the upper electrode 52 (lower electrode 51) can be placed in blank areas between the element electrodes 55 (56) of the lower electrode 51 (upper electrode 52). Then, for the purpose of protecting the electrode portions constituting the capacitor except the externally connecting electrodes 61, 62, a protection film, though not shown, is formed of resin, etc. on the uppermost layer.

It is preferable that solder bumps should be formed on the externally connecting electrodes 61, 62. The solder bumps may be formed by printing a solder cream on the externally connecting electrodes 61, 62 by using a solder mask and then rendering a resultant structure to pass through a solder reflow furnace. Otherwise, the solder bumps may be formed by depositing metal solder onto the externally connecting electrodes 61, 62 by using the evaporation method, etc. and then rendering a resultant structure to pass through the solder reflow furnace.

Like the above, the capacitor in the present embodiment can be mounted on the mother board 70 as a single body by providing the externally connecting electrodes 61, 62 on the substrate 24. Also, since the externally connecting electrodes 61, 62 are provided on the same surface as the surface on which the lower electrode 51 and the upper electrode 52 both constituting the capacitor are formed, surface mounting can be implemented by using a flip-chip mounting structure, i.e., as shown in FIG. 6B, the externally connecting electrodes 61, 62 are secured to a conductor pattern 72 formed on the mother board 70 by a solder 63 while they are opposed to the mother board 70. Since the externally connecting electrodes 61, 62 are made of the electrodes 57, 58 which are formed by firing the conductive paste on the substrate 24, sufficient adhesive strength of the electrodes 57, 58 to the substrate 24 can be afforded. Therefore, the capacitor in the present embodiment can have the strong adhesive strength to the mother board 70.

As described in the above embodiments, in the capacitor in the present embodiment, it is possible to supply, by mass production, the capacitor which has a high pattern forming precision because the element electrodes 56 (55) of one electrode 52 (51) are placed in the blank areas between the element electrodes 55 (56) of the other electrode 51 (52) and also the electrodes 51, 52 are opposed to each other via the dielectric layer 53, and in addition the patterns of the electrodes 51, 52 are formed by using the photolithography technology, and which has an extremely high precision capacitance value because deviation of the capacitance value due to the positional displacement caused in forming the lower electrode 51 and the upper electrode 52 can be avoided.

A low capacitance value and high precision (e.g., deviation of the capacitance is ±0.025 pF if the capacitor is employed at 0.5 pF±5%) is requested for the capacitor which is used in the high frequency band in excess of 1 GHz. For example, according to the surface mounting method in the prior art, the impedance occurring after the capacitor of the low capacitance has been mounted is also changed according to variation in an amount of the solder 63 which is employed to bond the parts. However, in the present embodiment, since an amount of solder can be adjusted in advance by providing the solder bumps on the externally connecting electrodes 61, 62 and also the capacitor is secured onto the mother board 70 by using such solder, the capacitor can be mounted onto the mother board 70 without variation of the impedance value caused after the high precision capacitor of the low capacitance has been mounted.

In the above embodiments, in the event that the dielectric layer is formed of ceramic, the dielectric layer can be coated in its liquid state by employing either a dielectric paste or a sol-gel method, so that it is easy to form the dielectric layer with high precision. However, if resin material is employed as the dielectric layer, there can be achieved such advantages that the high temperature firing step needed in the case where the ceramic material is employed can be omitted and thus the resin material may be processed at the curing temperature of less than 300° C. at best. In this case, for the purpose of enhancing the capacitance value, it is possible to employ the high dielectric constant material. In addition, if the resin material in which the high dielectric constant material formed of one or more of the ceramic powder, the glass powder, and the high dielectric constant resin powder is dispersed and mixed is employed, the capacitor with the target capacitance value can be easily implemented by changing material, a mixing ratio, etc.

The present invention may be applied as not only the parts of a single function, as described above, but also a part of composite parts such as a filter circuit, etc.

According to the invention of claims 1 to 4, since a structure is adopted in which the element electrodes of one electrode are arranged in the blank areas between the element electrodes of the other electrode, the variation of the capacitance value can be reduced small by canceling variation of the capacitance value on both sides of the element electrodes even when displacement is caused between the electrodes patterns, and therefore there can be provided the high precision capacitor which is capable of reducing variation of the capacitance value small. In addition, since the dielectric layer is interposed between the lower electrode and the upper electrode, both electrodes can be placed in the close vicinity with no possibility of short-circuit between the element electrodes. Therefore, it is possible to provide the capacitor having the larger capacitance value than the conventional capacitor in which the comb-type electrodes are opposed on the substrate surface.

According to the invention of claim 5, since the substrate is composed of the ceramic dielectric material and the substrate has the externally connecting electrodes connected to electrodes on a mother board, an advantage that the capacitor can be mounted on the mother board as a discrete part can be achieved, in addition to the advantages achieved by claims 1 to 4.

According to the invention of claim 6, since the externally connecting electrodes are formed on the surface of the substrate on which the lower electrode and the upper electrode are formed, such an advantage can be achieved, in addition to the advantages achieved by claim 5, that it is possible to provide the capacitor which enables surface mounting onto the mother board and has a smaller mounting area and strong sticking strength to the mother board.

According to the invention of claim 7, since solder precoats or solder bumps are formed on the externally connecting electrodes, such advantages can be achieved, in addition to the advantages achieved by claims 5 and 6, that it is possible to provide the capacitor whose soldering is made easy and which has small variation of the impedance due to the soldering since an amount of solder can be set previously if the solder bumps are employed.

According to the invention of claim 8, since the upper electrode and the lower electrode are formed by using the photolithography respectively, an advantage can be achieved, in addition to the advantages achieved by claims 1 to 7, that the capacitor having the high precision capacitance value can be implemented.

According to the invention of claim 9, since the dielectric layer is formed of resin material, such an advantage can be achieved, in addition to the advantages achieved by claims 1 to 8, that the high temperature firing step, which needed in using the ceramic material, can be omitted.

According to the invention of claim 10, since, in the capacitor wherein the resin material is employed as the dielectric layer, high dielectric constant material which is formed of one or more of ceramic powder, glass powder, and high dielectric constant resin powder is dispersed and mixed in the resin material, such advantages can be achieved, in addition to the advantages achieved by claims 1 to 9, that the dielectric layer having the higher dielectric constant than the resin material can be implemented, the dielectric layer having desired dielectric constant can be easily obtained, and the desired capacitance value can be accomplished readily.

According to the invention of claim 11, since the dielectric layer is formed by firing the dielectric paste, an advantage that the dielectric layer can be formed easily with good precision can be achieved, in addition to the advantages achieved by claims 1 to 8.

What is claimed is:

1. A capacitor constructed by forming a lower electrode on a substrate, then forming a dielectric layer on the lower electrode, and then forming an upper electrode on the dielectric layer, wherein one electrode of the lower electrode and the upper electrode has frame-like element electrodes which construct a continuous ladder shape while other electrode of the lower electrode and the upper electrode is formed like a comb shape, and element electrodes of the other electrode formed like the comb shape are placed in blank areas between the frame-like element electrodes of one electrode.

2. The capacitor of claim 1, wherein the lower electrode and the upper electrode are formed by using photolithography.

3. The capacitor of claim 1, wherein the dielectric layer is formed of resin material.

4. The capacitor of claim 1, wherein the dielectric layer is formed by coating a dielectric paste and firing the dielectric paste.

5. A capacitor constructed by forming a lower electrode on a substrate, then forming a dielectric layer on the lower electrode, and then forming an upper electrode on the dielectric layer, wherein one electrode of the lower electrode and the upper electrode has a plurality of loop portions, and element electrodes of an other electrode of the lower electrode and the upper electrode are placed in blank areas of the loop portions of the one electrode.

6. The capacitor of claim 5, wherein the lower electrode and the upper electrode are formed by using photolithography.

7. The capacitor of claim 5, wherein the dielectric layer is formed of resin material.

8. The capacitor of claim 5, wherein the dielectric layer is formed by coating a dielectric paste and firing the dielectric paste.

* * * * *